US011029380B2

(12) United States Patent
Nitta et al.

(10) Patent No.: US 11,029,380 B2
(45) Date of Patent: Jun. 8, 2021

(54) MAGNETIC RESONANCE IMAGING APPARATUS

(71) Applicant: Canon Medical Systems Corporation, Otawara (JP)

(72) Inventors: Shuhei Nitta, Ota Tokyo (JP); Shigehide Kuhara, Otawara Tochigi (JP); Tomoyuki Takeguchi, Kawasaki Kanagawa (JP); Taichiro Shiodera, Shinagawa Tokyo (JP); Yukinobu Sakata, Kawasaki Kanagawa (JP)

(73) Assignee: TOSHIBA MEDICAL SYSTEMS CORPORATION, Otawara (JP)

( * ) Notice: Subject to any disclaimer, the term of this patent is extended or adjusted under 35 U.S.C. 154(b) by 35 days.

(21) Appl. No.: 16/279,613

(22) Filed: Feb. 19, 2019

(65) Prior Publication Data

US 2019/0187232 A1    Jun. 20, 2019

Related U.S. Application Data

(63) Continuation of application No. 14/579,532, filed on Dec. 22, 2014, now Pat. No. 10,215,824.

(30) Foreign Application Priority Data

Dec. 27, 2013  (JP) ................................. 2013-273048

(51) Int. Cl.
*A61B 5/05* (2021.01)
*G06K 9/36* (2006.01)
*G01R 33/54* (2006.01)

(52) U.S. Cl.
CPC ................................. *G01R 33/546* (2013.01)

(58) Field of Classification Search
CPC ....... A61B 5/055; A61B 5/062; A61B 5/0044; A61B 8/463; G01R 33/4835; G01R 33/546; G06T 2207/10004; G06T 2207/10088
See application file for complete search history.

(56) References Cited

U.S. PATENT DOCUMENTS

| 5,107,838 | A | 4/1992 | Yamaguchi |
| 7,280,862 | B2 | 10/2007 | Gupta et al. |

(Continued)

FOREIGN PATENT DOCUMENTS

| JP | H04-218139 | 8/1992 |
| JP | 2006-055641 | 3/2006 |

(Continued)

OTHER PUBLICATIONS

"CMR Image Acquisition Protocols," Version 1.0, Mar. 2007, http://scmr.jp/mri/pdf/scmr_protocols_2007.pdf.

(Continued)

*Primary Examiner* — Alesa Allgood
(74) *Attorney, Agent, or Firm* — Nixon & Vanderhye, P.C.

(57) ABSTRACT

A magnetic resonance imaging apparatus according to an embodiment includes a processor and a memory. The memory stores processor-executable instructions that cause the processor to detect cross-sectional positions of a plurality of cross-sectional images to be acquired in an imaging scan from volume data; acquire the cross-sectional images in sequence based on the cross-sectional positions by executing the imaging scan; and after the first cross-sectional image is acquired in the imaging scan, generate a display image, and display the display image on a display, the display image being an image in which a cross-sectional position of a second cross-sectional image which is detected from the volume data is superimposed on the first cross-sectional (Continued)

image, the second cross-sectional image being a cross-sectional image before being acquired and intersecting with the first cross-sectional image.

18 Claims, 10 Drawing Sheets

(56) References Cited

U.S. PATENT DOCUMENTS

| | | | |
|---|---|---|---|
| 7,966,055 B2 | 6/2011 | Guehring et al. | |
| 9,348,006 B2 | 5/2016 | Nitta et al. | |
| 9,709,653 B2* | 7/2017 | Wheaton | G01R 33/24 |
| 9,746,535 B2 | 8/2017 | Nitta et al. | |
| 2007/0167711 A1* | 7/2007 | Seki | A61B 8/08 |
| | | | 600/407 |
| 2008/0009709 A1* | 1/2008 | Guehring | A61B 5/055 |
| | | | 600/414 |
| 2012/0093385 A1 | 4/2012 | Yokosawa et al. | |
| 2012/0121154 A1* | 5/2012 | Xue | G06T 7/33 |
| | | | 382/131 |
| 2012/0126812 A1 | 5/2012 | Nitta et al. | |
| 2012/0314924 A1* | 12/2012 | Carlton | G06T 7/38 |
| | | | 382/131 |
| 2013/0126812 A1 | 5/2013 | Redaelli et al. | |
| 2013/0154646 A1 | 6/2013 | Nitta et al. | |
| 2013/0285662 A1 | 10/2013 | Takeshima | |
| 2014/0191756 A1 | 7/2014 | Yokosawa et al. | |
| 2015/0185302 A1 | 7/2015 | Nitta et al. | |
| 2016/0238682 A1 | 8/2016 | Nitta et al. | |

FOREIGN PATENT DOCUMENTS

| | | |
|---|---|---|
| JP | 2007-319689 A | 12/2007 |
| JP | 2012-110689 | 6/2012 |
| JP | 2013-027540 A | 2/2013 |
| JP | 2013-102889 A | 5/2013 |
| WO | 2010-150783 | 12/2010 |
| WO | 2013/027540 A1 | 2/2013 |

OTHER PUBLICATIONS

Christopher M. Kramer, et al., "Standardized cardiovascular magnetic resonance task force imaging (CMR) protocols, society for cardiovascular magnetic resonance: board of trustees on standardized protocols," Jul. 7, 2008, http://www.jcmr-online.com/content/10/1/35.

"Planning the basic cardiac views," http://www.scmr.org/assets/files/members/documents/Cardiac_views.pdf.

"Aortic Valve Study: Step by Step AO Function and Flow," Mar. 2, 2005, http://www.scmr.org/assets/files/technologists/aoflow.pdf.

Japanese office action dated Aug. 14, 2018 in Patent Application No. JP 2014-248429.

"Mitral Valve Study: Step by Step Mitral Valve Flow", Revised Dec. 10, 2005, http://www.scmr.org/assets/files/technologists/mitral_valve.pdf (3 pages).

Japanese office action dated Dec. 17, 2019, in Patent Application No. JP 2019-023134.

* cited by examiner

FIG.5

| ID | CROSS-SECTIONAL POSITION |
|---|---|
| 01 | o01, u01, v1 |
| 02 | o02, u02, v2 |
| 03 | o03, u03, v3 |
| 04 | o04, u04, v4 |
| 05 | o05, u05, v5 |
| 06 | o06, u06, v6 |
| 07 | o07, u07, v7 |
| 08 | o08, u08, v8 |
| 09 | o09, u09, v9 |
| 10 | o10, u010, v10 |
| 11 | o11, u011, v11 |
| 12 | o12, u012, v12 |
| 13 | o13, u013, v13 |
| 14 | o14, u014, v14 |
| 15 | o15, u015, v15 |

FIG.8

| Protocol | ID | Confirm | FOV | NS | NP | Matrix | FA |
|---|---|---|---|---|---|---|---|
| multi-slice | | | *** | *** | *** | *** | *** |
| LSA-cine | 04 | 08 | *** | *** | *** | *** | *** |
| L3ch-cine | 08 | 09, 10 | *** | *** | *** | *** | *** |
| LVOT-cine | 09 | 10 | *** | *** | *** | *** | *** |
| AV-cine | 10 | | *** | *** | *** | *** | *** |

FIG.9

| Index Protocol | | Confirm | FOV | NS | NP | Matrix | FA |
|---|---|---|---|---|---|---|---|
| D | multi-slice | - | *** | *** | *** | *** | *** |
| E | LSA-cine | F | *** | *** | *** | *** | *** |
| F | L3ch-cine | G, H | *** | *** | *** | *** | *** |
| G | LVOT-cine | H | *** | *** | *** | *** | *** |
| H | AV-cine | - | *** | *** | *** | *** | *** |

FIG.10

| Protocol | ID | Confirm | FOV | NS | NP | Matrix | FA |
|---|---|---|---|---|---|---|---|
| multi-slice | | | *** | *** | *** | *** | *** |
| LSA-cine | 04 | 08 | *** | *** | *** | *** | *** |
| L4ch-cine | 06 | | *** | *** | *** | *** | *** |
| L3ch-cine | 08 | 09, 10 | *** | *** | *** | *** | *** |
| LVOT-cine | 09 | 10 | *** | *** | *** | *** | *** |
| AV-cine | 10 | | *** | *** | *** | *** | *** |

FIG.11

| Index | Protocol | Confirm | FOV | NS | NP | Matrix | FA |
|---|---|---|---|---|---|---|---|
| D | multi-slice | - | *** | *** | *** | *** | *** |
| E | LSA-cine | F | *** | *** | *** | *** | *** |
| F | L4ch-cine | | *** | *** | *** | *** | *** |
| G | L3ch-cine | H, I | *** | *** | *** | *** | *** |
| H | LVOT-cine | I | *** | *** | *** | *** | *** |
| I | AV-cine | - | *** | *** | *** | *** | *** |

FIG.12
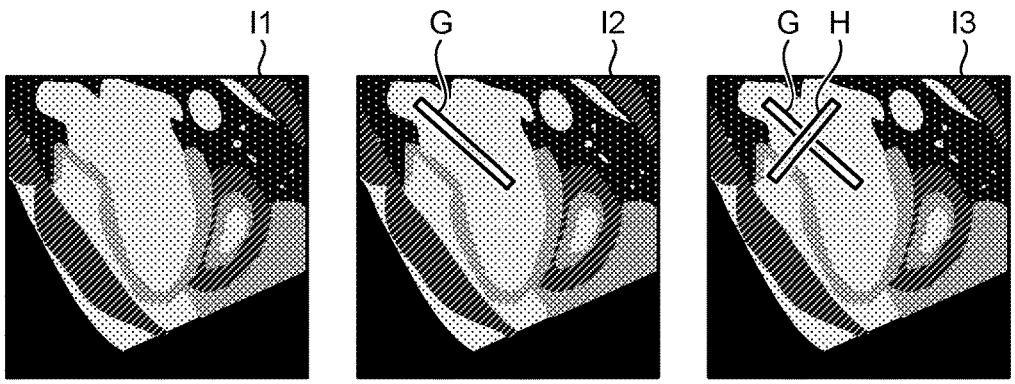
FIG.13A             FIG.13B             FIG.13C
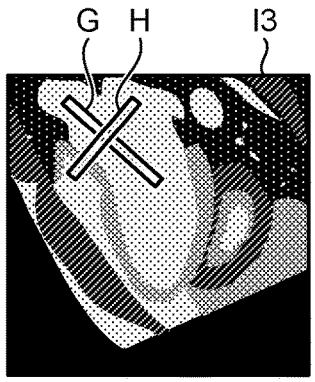 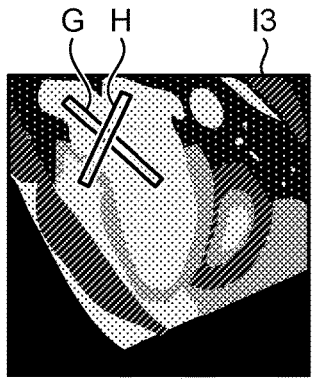 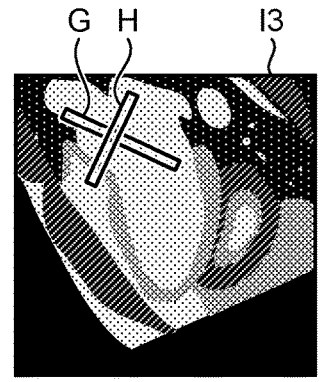

MAGNETIC RESONANCE IMAGING APPARATUS

CROSS-REFERENCE TO RELATED APPLICATION(S)

This application is a continuation of U.S. application Ser. No. 14/579,532 filed Dec. 22, 2014, now U.S. Pat. No. 10,215,824, issued Feb. 26, 2019, and is based upon and claims the benefit of priority from Japanese Patent Application No. 2013-273048, filed on Dec. 27, 2013; the entire contents of which are incorporated herein by reference.

FIELD

Embodiments described herein relate generally to a magnetic resonance imaging apparatus.

BACKGROUND

Magnetic resonance imaging is an imaging method in which atomic nuclear spins of a subject who is placed in a static magnetic field are magnetically excited with a radio frequency (RF) pulse at the Larmor frequency, and from a magnetic resonance signal generated in association with the excitation, an image is reconstructed.

As for cardiac study by magnetic resonance imaging, a standardized protocol has been defined. For example, the standardized protocol defines a sequence in which, after acquiring scout images (locator images) (for example, transverse section images (axial images), sagittal section images (sagittal images), and coronal section images (coronal images)), multi-slice images that are a plurality of transverse section images are acquired, and then reference cross-sectional images are acquired. The reference cross-sectional images are cross-sectional images based on anatomical characteristics of heart, and the examples thereof include, but are not limited to, left ventricular vertical long-axis images, left ventricular horizontal long-axis images, left/right ventricular short-axis images, left/right ventricular 2-chamber long-axis images, left/right ventricular 3-chamber long-axis images, left/right ventricular 4-chamber long-axis images, left/right ventricular outflow tract images, aorta valve images, and pulmonary valve images. In the study of target regions other than the heart such as "brains" and joints such as "shoulders" and "knees", there are sequences equivalent to the above-described acquisition of the reference cross-sectional images.

Conventionally, the operation of positioning reference cross-sectional images has been a problem. For example, there are methods that automatically detect cross-sectional positions of the reference cross-sectional images by determining a blood region of ventricles from the images, and by detecting the axis of the heart from the multi-slice images. In these methods, however, the accuracy of automatically detected cross-sectional position may deteriorate due to a time lag between the acquisition of multi-slice images and the acquisition of each of the reference cross-sectional images. For example, if the body of a subject is moved after the acquisition of multi-slice images during the acquisition of respective reference cross-sectional images, the cross-sectional positions of the subsequently acquired reference cross-sectional images are all displaced.

Meanwhile, in the case of manual positioning as defined in the standardized protocol, for example, because the positioning is a method in which the reference cross-sectional images acquired immediately before are used to position a subsequent reference cross-sectional image, the risk of deterioration in the accuracy of cross-sectional position by the time lag is low. The manual method, however, is very cumbersome, and is also inefficient because even the cross-sectional images not necessary for diagnosis have to be acquired for the positioning of reference cross-sectional images.

BRIEF DESCRIPTION OF THE DRAWINGS

FIG. 5 is a table illustrating one example of cross-sectional image information stored in a storage in the first embodiment;

FIG. 8 is a table illustrating one example of protocol information stored in the storage in the first embodiment;

FIG. 9 is a table for explaining a setting screen for the combination of superimposing images in the first embodiment;

FIG. 10 is a table for explaining the updating of protocol information via the setting screen in the first embodiment;

FIG. 11 is a table for explaining the changes in display of the setting screen in the first embodiment;

FIG. 12 is a diagram illustrating a display example of display images in the first embodiment; and FIGS. 13A to 13C are diagrams for explaining the correction of cross-sectional positions in the first embodiment.

DETAILED DESCRIPTION

A magnetic resonance imaging apparatus according to an embodiment includes a processor and a memory. The memory stores processor-executable instructions that cause the processor to detect cross-sectional positions of a plurality of cross-sectional images to be acquired in an imaging scan from volume data; acquire the cross-sectional images in sequence based on the cross-sectional positions by executing the imaging scan; and after the first cross-sectional image is acquired in the imaging scan, generate a display image, and display the display image on a display, the display image being an image in which a cross-sectional position of a second cross-sectional image which is detected from the volume data is superimposed on the first cross-sectional image, the second cross-sectional image being a cross-sectional image before being acquired and intersecting with the first cross-sectional image.

First Embodiment

Figure 1:
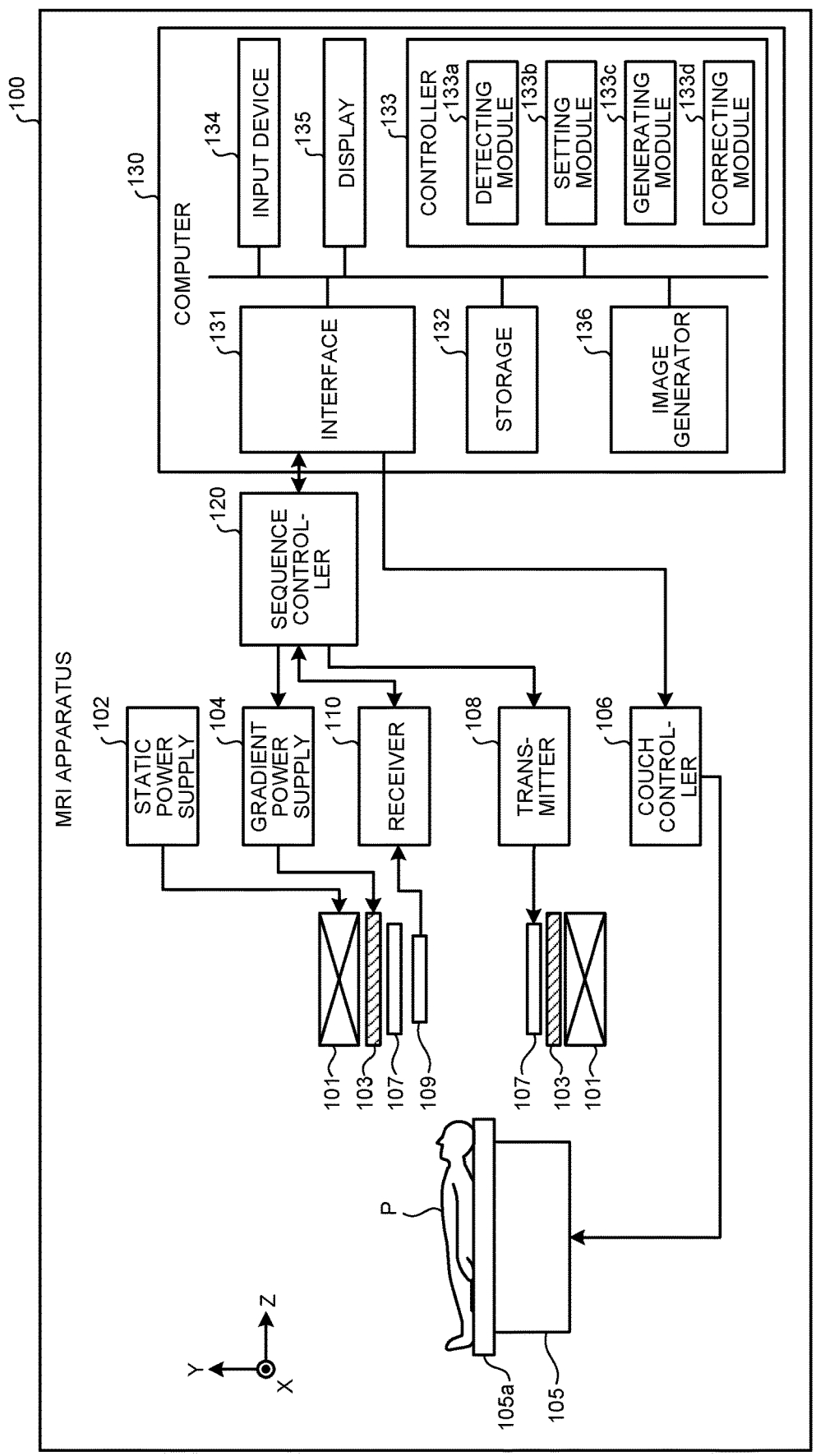
FIG. 1 is a functional block diagram illustrating the configuration of an MRI apparatus according to a first embodiment.

FIG. 1 is a functional block diagram illustrating a configuration of an MRI apparatus 100 according to a first embodiment. As illustrated in FIG. 1, the MRI apparatus 100 includes a static magnetic field magnet 101, a static magnetic field power source 102, a gradient coil 103, a gradient magnetic field power source 104, a couch 105, a couch controller 106, a transmission coil 107, a transmitter 108, a reception coil 109, a receiver 110, a sequence controller 120, and a computer 130. The MRI apparatus 100 does not include a subject P (such as a human body).

The static magnetic field magnet 101 is a hollow magnet having a cylindrical shape, and generates a static magnetic field in the inside space thereof. For example, the static magnetic field magnet 101 is a superconductive magnet, and excited with an electric current supplied from the static magnetic field power source 102. The static magnetic field power source 102 supplies an electric current to the static magnetic field magnet 101. The static magnetic field magnet 101 may be a permanent magnet, and in such a case the MRI apparatus 100 may not include the static magnetic field power source 102. The static magnetic field power source 102 may be provided separately from the MRI apparatus 100.

The gradient coil 103 is a hollow coil having a cylindrical shape, and disposed inside the static magnetic field magnet 101. The gradient coil 103 is formed of a combination of three coils that correspond to respective axes of X, Y, and Z that are orthogonal to each other. The three coils are individually supplied with an electric current from the gradient magnetic field power source 104, and each generate a gradient magnetic field having a magnetic field strength that varies along the respective axes of X, Y, and Z. Here, the Z-axial direction is the same as that of the static magnetic field.

The gradient magnetic field power source 104 supplies an electric current to the gradient coil 103. The gradient magnetic fields on the respective axes of X, Y, and Z generated by the gradient coil 103 correspond to a slice-selecting gradient magnetic field Gs, a phase-encoding gradient magnetic field Ge, and a read-out gradient magnetic field Gr, respectively, for example. The slice-selecting gradient magnetic field Gs is used to determine a given imaging cross-section. The phase-encoding gradient magnetic field Ge is used to alter the phase of an MR signal depending on a spatial location. The read-out gradient magnetic field Gr is used to alter the frequency of the MR signal depending on the spatial location.

The couch 105 includes a couchtop 105*a* on which a subject P is placed, and inserts the couchtop 105*a* in a state where the subject P is placed thereon into a hollow (opening for imaging) of the gradient coil 103, under the control of the couch controller 106. Generally, the couch 105 is installed such that the longitudinal direction thereof is parallel with the central axis of the static magnetic field magnet 101. The couch controller 106 drives the couch 105 to move the couchtop 105*a* in the longitudinal direction and the vertical direction, under the control of the computer 130.

The transmission coil 107 is disposed inside the gradient coil 103, and supplied with RF pulses from the transmitter 108 to generate a high-frequency magnetic field. The transmitter 108 supplies the transmission coil 107 with RF pulses corresponding to a Larmor frequency that is determined based on the type of target atoms and a magnetic field strength.

The reception coil 109 is disposed inside the gradient coil 103, and receives an MR signal generated from the subject P by influence of the high-frequency magnetic field. When the reception coil 109 receives an MR signal, the reception coil 109 outputs the received MR signal to the receiver 110.

The receiver 110 generates MR data based on the MR signal that is output from the reception coil 109. Specifically, the receiver 110 generates MR data by converting the MR signal that is output from the reception coil 109 into digital data. The receiver 110 also transmits the generated MR data to the sequence controller 120. The receiver 110 may be provided on the gantry device that includes the static magnetic field magnet 101 and the gradient coil 103.

The sequence controller 120 drives the gradient magnetic field power source 104, the transmitter 108, and the receiver 110 based on sequence information transmitted from the computer 130, thereby imaging the subject P. The sequence information is information that defines a process for executing imaging. The sequence information defines the intensity of the power source to be supplied from the gradient magnetic field power source 104 to the gradient coil 103, timing at which the power source is supplied, the intensity of RF pulses to be transmitted from the transmitter 108 to the transmission coil 107, timing at which the RF pulses are applied, and timing at which the receiver 110 detects an MR signal, for example.

When the sequence controller 120 receives MR data from the receiver 110 as a result of driving the gradient magnetic field power source 104, the transmitter 108, and the receiver 110 to image the subject P, the sequence controller 120 transmits the received MR data to the computer 130.

The computer 130 controls the MRI apparatus 100 overall, performs data acquisition, image reconstruction, and others, and includes an interface 131, a storage 132, a controller 133, an input device 134, a display 135, and an image generating module 136.

The interface 131 sends the sequence information to the sequence controller 120 and receives the MR data from the sequence controller 120. Upon receiving the MR data, the interface 131 stores the received MR data in the storage 132. The MR data stored in the storage 132 is disposed in k-space by the controller 133. As a result, the storage 132 stores therein k-space data.

The storage 132 stores therein the MR data received by the interface 131, the k-space data disposed in the k-space by the controller 133, image data generated by the image generating module 136, and others. The storage 132 is a semiconductor memory device such as a random access memory (RAM) and a flash memory, a hard disk, and an optical disk, for example.

The input device 134 receives various instructions and information inputs from an operator. The input device 134 is a pointing device such as a mouse and a trackball, and an input device such as a keyboard. The display 135 displays, under the control of the controller 133, a graphical user interface (GUI) to receive the input of imaging condition, images generated by the image generating module 136, and others. The display 135 is, for example, a display device such as a liquid crystal display.

The controller 133 performs an overall control of the MRI apparatus 100, and controls the imaging, generation of images, display of images, and others. For example, the controller 133 receives an input of imaging condition (such as imaging parameters) on the GUI, and generates sequence information in response to the received imaging condition. Furthermore, the controller 133 sends the generated sequence information to the sequence controller 120. The controller 133 includes one or more circuitries such as an integrated circuit such as an ASIC and an FPGA, a CPU, and an MPU, for example. The controller 133 in the first embodiment includes a detecting module 133*a*, a setting module 133*b*, a generating module 133*c*, and a correcting module 133*d*. The details of the above-described modules will be described later. The controller 133 includes, for example, a processor and a memory. The memory stores processor-executable instructions that, when executed by the processor, cause the processor to perform processes described later as being performed by the controller 133.

The image generating module 136 reads out the k-space data from the storage 132, and by performing reconstruction processing such as Fourier transformation on the read-out k-space data, generates an image. In the first embodiment, the image generating module 136 performs, under the control of the generating module 133c, the reconstruction processing of image as necessary.

An outline of processing performed by the MRI apparatus 100 in the first embodiment will now be described. Prior to the acquisition of reference cross-sectional images in imaging scans, when volume data is acquired in preparatory scans, the MRI apparatus 100 first detects cross-sectional positions of a plurality of reference cross-sectional images from the volume data automatically. The MRI apparatus 100 sets the type of reference cross-sectional images to be acquired in the imaging scans and the order of imaging. The MRI apparatus 100 further sets the combinations indicating on which reference cross-sectional image, the cross-sectional position of which reference cross-sectional image is to be checked by the operator in the process of imaging scans. Then, upon starting of the execution of imaging scans, the MRI apparatus 100 acquires reference cross-sectional images in sequence in accordance with the set order of imaging. The MRI apparatus 100 further generates, each time a reference cross-sectional image (first cross-sectional image) is acquired, a display image in which the cross-sectional position (that has previously been detected automatically) of a reference cross-sectional image planned to be acquired at a later stage (second cross-sectional image) is displayed superimposed on the acquired reference cross-sectional image (first cross-sectional image) in accordance with the set combination, and displays the generated display image on the display 135. When a correction operation concerning the cross-sectional position by the operator is received on the display image, the MRI apparatus 100 corrects the cross-sectional position of the reference cross-sectional image planned to be acquired (second cross-sectional image) and the cross-sectional positions of other reference cross-sectional images relevant thereto, and moves on to the acquisition of subsequent reference cross-sectional images.

Figure 2:
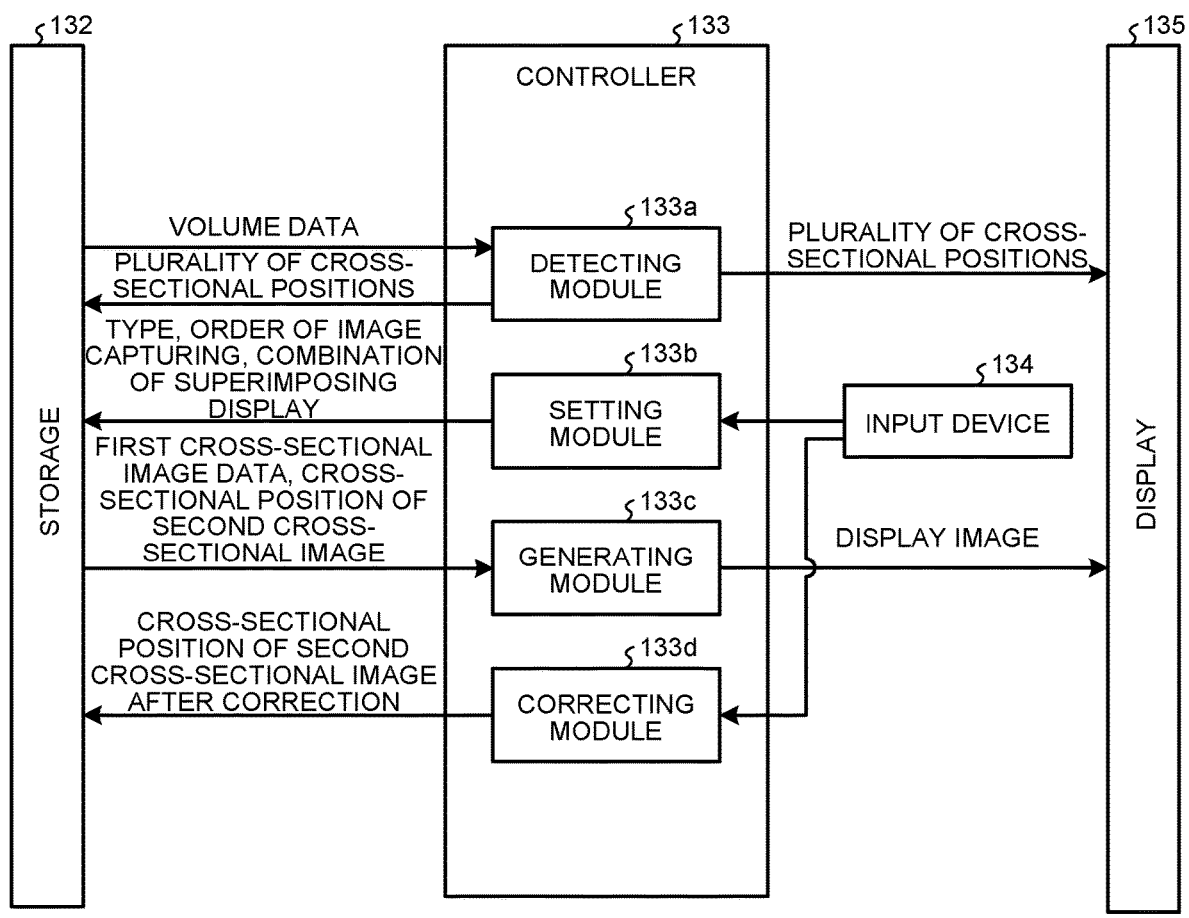
FIG. 2 is a functional block diagram illustrating the configuration of a controller in the first embodiment.

In the first embodiment, the controller 133 performs the various processes described above. FIG. 2 is a functional block diagram illustrating the configuration of the controller 133 in the first embodiment. As illustrated in FIG. 2, the controller 133 includes the detecting module 133a, the setting module 133b, the generating module 133c, and the correcting module 133d.

The detecting module 133a acquires, from the storage 132, volume data that is acquired in preparatory scans and stored in the storage 132, and from the volume data, automatically detects cross-sectional positions of a plurality of reference cross-sectional images. The detecting module 133a stores the automatically detected cross-sectional positions in the storage 132. The detecting module 133a further displays the automatically detected cross-sectional positions on the display 135.

The setting module 133b, by the protocol information set in advance or by receiving a setting operation from the operator via the input device 134, sets the types of reference cross-sectional images to be acquired in imaging scans and the order of imaging (also referred to as "acquisition order"). The setting module 133b further sets the combinations indicating on which reference cross-sectional image, the cross-sectional position of which reference cross-sectional image is to be checked by the operator, out of the reference cross-sectional images planned to be acquired at later stages, in the process of imaging scans. For example, the setting module 133b displays on the display 135 a setting screen on which the protocol information for acquiring each reference cross-sectional image is arranged in the order of imaging the respective reference cross-sectional images, and on the setting screen, receives a setting operation of combination from the operator. The setting module 133b then stores in the storage 132 the types of reference cross-sectional images, the order of imaging, and the combinations of superimposing display.

In the following description, for the convenience of explanation, a reference cross-sectional image that has been acquired (that is, the reference cross-sectional image to be the base of a superimposed display) is referred to as a "first cross-sectional image" and the reference cross-sectional image for which the cross-sectional position is displayed superimposed on the first cross-sectional image is referred to as a "second cross-sectional image". The second cross-sectional image is selected from the reference cross-sectional images for which the order of imaging is set later than the first cross-sectional image. Hence, the same reference cross-sectional image can be a "first cross-sectional image" and can be a "second cross-sectional image", depending on the stage of acquisition.

The generating module 133c, when a first cross-sectional image is acquired by imaging scans, generates a display image in which a cross-sectional position that is of a second cross-sectional image before acquisition and detected from the volume data is superimposed on the acquired first cross-sectional image, and displays the generated display image on the display 135. For example, when a first cross-sectional image is acquired by imaging scans, the generating module 133c refers to the combinations of superimposing display stored in the storage 132, and acquires first cross-sectional image data from the storage 132 and acquires the cross-sectional positions of the second cross-sectional images. The generating module 133c then generates a display image in which the cross-sectional position of the second cross-sectional image is superimposed on the first cross-sectional image, and displays the generated display image on the display 135.

The correcting module 133d receives a correction operation concerning the cross-sectional position of the second cross-sectional image from the operator performed on the above-described display image via the input device 134, and corrects the cross-sectional position of the second cross-sectional image. The correcting module 133d further overwrites the cross-sectional position of the second cross-sectional image stored in the storage 132 with the cross-sectional position after the correction.

Figure 3:
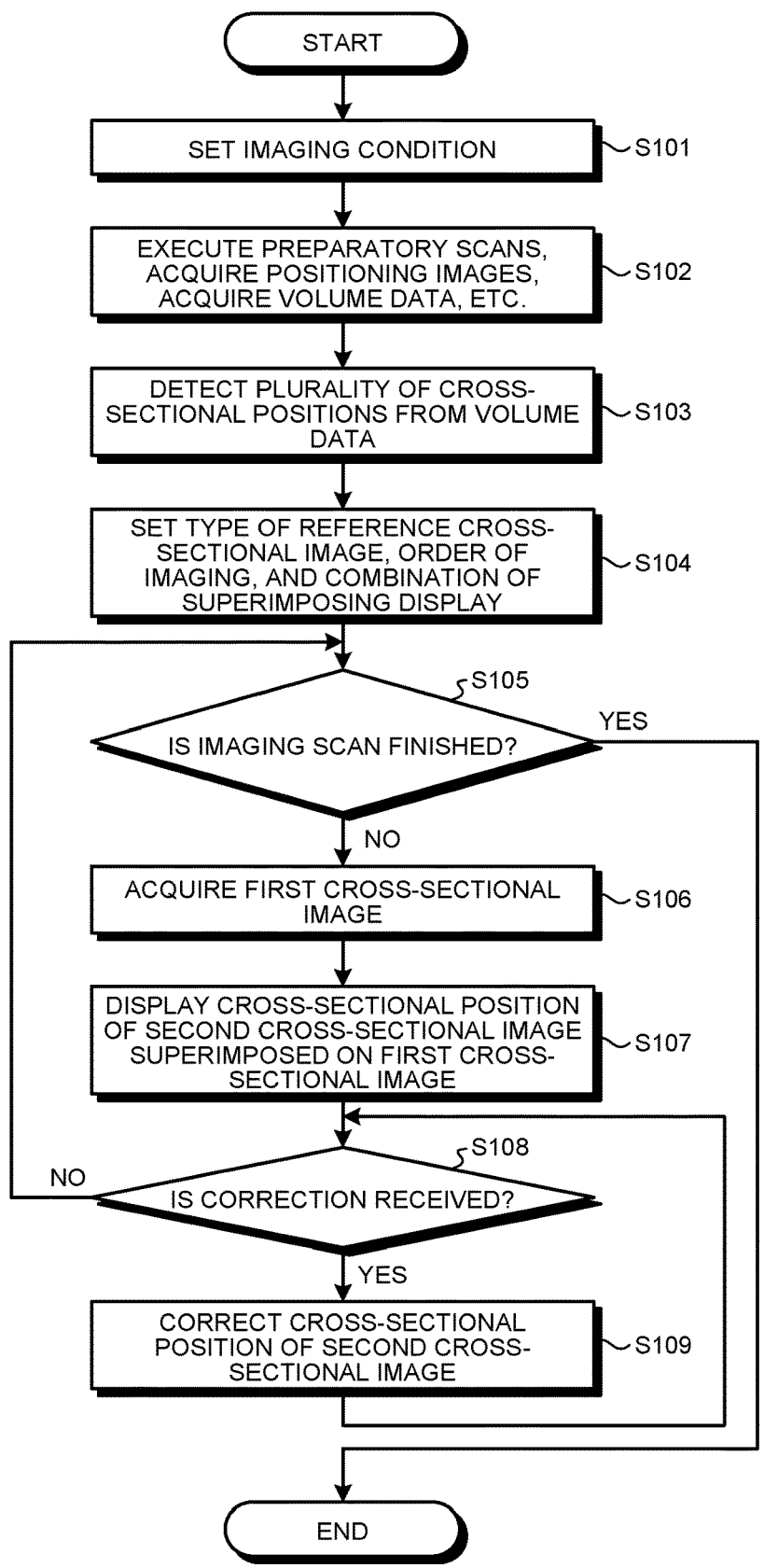
FIG. 3 is a flowchart illustrating a processing procedure performed in the first embodiment.

FIG. 3 is a flowchart illustrating a processing procedure performed in the first embodiment. In the first embodiment, a target region is defined as "heart", and the types of reference cross-sectional images and the order of imaging thereof are defined as "left ventricular short-axis image", "left ventricular 3-chamber long-axis image", "left ventricular outflow tract image", and "aorta valve image", and in addition, studying by "cine imaging" is assumed, in which data for generating a group of images continuous along a time series is acquired. In the first embodiment, the MRI apparatus 100 sets the "left ventricular 3-chamber long-axis image" as the second cross-sectional image to be displayed superimposed on the "left ventricular short-axis image" for checking, sets the "left ventricular outflow tract image" and the "aorta valve image" as the second cross-sectional images to be displayed superimposed on the "left ventricular 3-chamber long-axis image" for checking, and sets the "aorta valve image" as the second cross-sectional image to be displayed superimposed on the "left ventricular outflow tract image" for checking. In the following description, imaging scans are imaging to acquire images used mainly for diagnosis (also referred to as "main imaging" and others), and preparatory scans are typically the imaging performed prior to the imaging scans (also referred to as "preparatory imaging" and others).

Step S101: the setting module 133b receives a setting from the operator via the input device 134 and sets an imaging condition. The operator selects, on a GUI for inputting imaging condition, a series of protocol groups to obtain the images of heart (e.g., protocol for acquiring positioning images, protocol for acquiring volume data, protocol for acquiring sensitivity distribution information, protocol for acquiring shimming information, and protocol for imaging scans), for example. The protocol is pulse sequence information that includes preliminary setting information (preset information) on the imaging condition.

Figure 4:
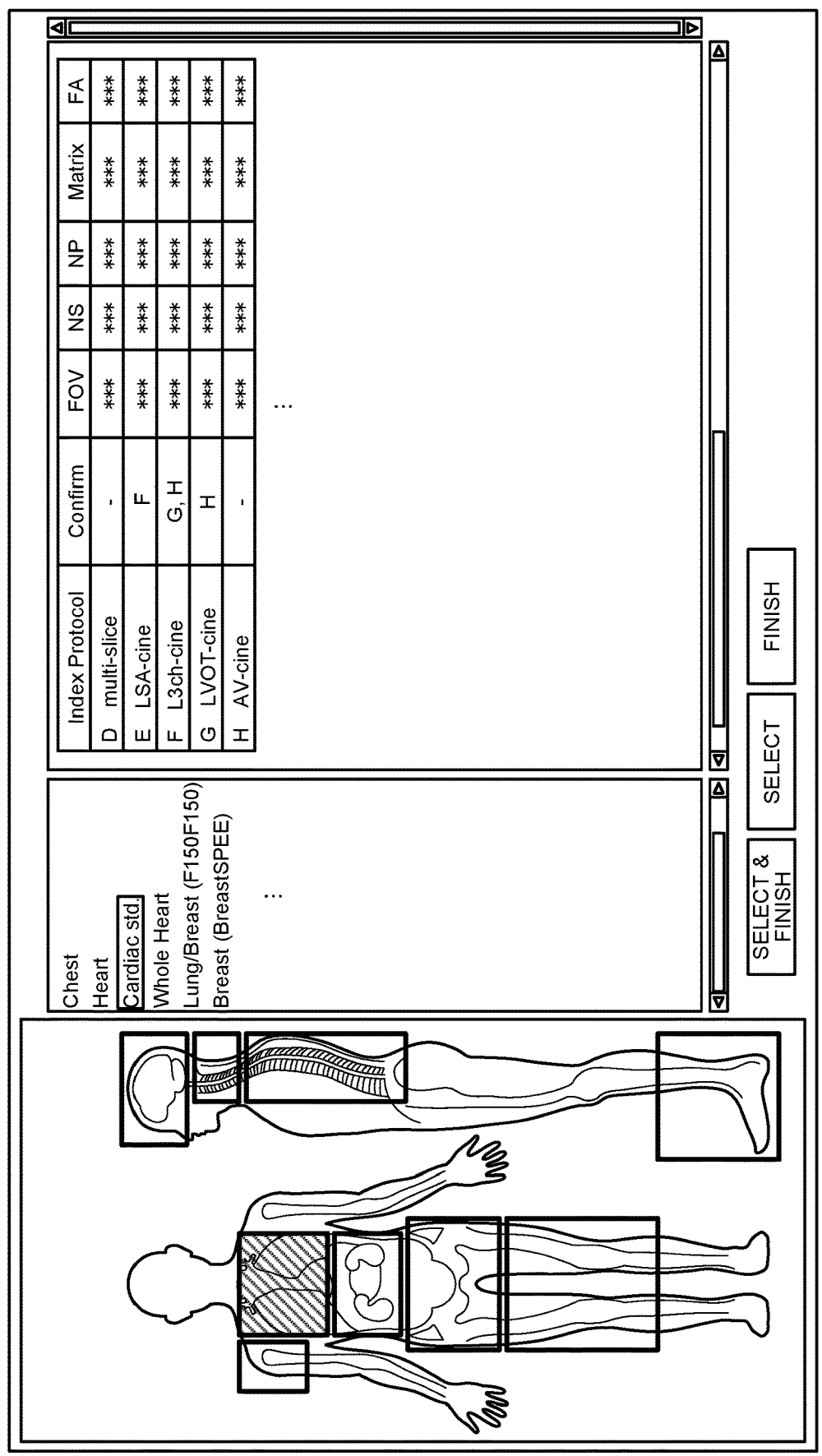
FIG. 4 is a diagram for explaining a GUI for inputting imaging condition in the first embodiment.

FIG. 4 is a diagram for explaining the GUI for inputting imaging condition in the first embodiment. For example, when the operator such as a radiologists and a technologists plans an imaging plan for study, the operator reads out the protocol groups managed and provided by the MRI apparatus 100 on the GUI for inputting imaging condition, and enters the setting information preset for each purpose of imaging in the imaging plan while correcting the information as necessary. In each protocol information, as illustrated in FIG. 4, included are, other than an index (index) indicative of the order of imaging and the type of reference cross-sectional image (protocol), the setting information on various imaging parameters such as the range of imaging (FOV: field of view), the number of slices (NS: the number of slices), the number of time phases (NP: the number of phases), a matrix size, and a flip angle (FA: flip angle). In the first embodiment, as one of the imaging parameters, the combination of superimposing display (Confirm) is included. The protocol information is stored in the storage 132, for example. This point will be described later in detail. In FIG. 4, the specific numbers of various imaging parameters are omitted for the sake of convenience in explanation.

Step S102: the sequence controller 120 then performs, in accordance with the series of protocol groups set at Step S101, the acquisition of positioning images, the acquisition of volume data, and other preparatory scans. For example, the sequence controller 120 acquires transverse section images, sagittal section images, and coronal section images as positioning images. The setting module 133b then displays these positioning images on the display 135, and receives the setting of imaging position of volume data which is acquired at a later stage. In the first embodiment, the volume data is multi-slice images including the heart and is a plurality of transverse section images, for example. The sequence controller 120 acquires multi-slice images in breath-hold by limiting the timing of acquisition to a diastole phase while performing electrocardiogram (ECG) synchronization, for example. The multi-slice images may be a plurality of sagittal section images or coronal section images. The sequence controller 120 uses, for the acquisition of multi-slice images, a pulse sequence of 2D fast field echo (FFE), 2D steady-state free precession (SSFP), 3D FFE, or 3D SSFP, for example.

Step S103: the detecting module 133a then detects the cross-sectional positions of a plurality of reference cross-sectional images from the volume data acquired at Step S102.

The cross-sectional position (imaging position) of a reference cross-sectional image will be described. The cross-sectional position means a spatial location in a three-dimensional image space and is expressed with a plurality of parameters. In the following description, these parameters are referred to as "location parameters". The location parameters are, as illustrated in the following Expression 1 and Expression 2, expressed with a center coordinate point o and two orthogonal unit vectors u and v, for example.

$$o=(o_x,o_y,o_z) \quad (1)$$

$$u=(u_x,u_y,u_z), \ v=(v_x,v_y,v_z) \quad (2)$$

The detection of cross-sectional position of a reference cross-sectional image is to obtain these location parameters o, u, and v. The location parameters detected by the detecting module 133a for each reference cross-sectional image are stored in the storage 132. The expression method of the location parameters is not limited to the above-described expression method. The location parameters may be expressed not in a three-dimensional image space but in a three-dimensional device space defined based on the center of the magnetic field of the MRI apparatus 100, the longitudinal direction of the couch thereof, and others, or may be expressed not with the center coordinate point and two orthogonal unit vectors but with three coordinate points, for example. In other words, the method only needs to be an expression method that uniquely defines the cross-sectional position of the reference cross-sectional image geometrically.

For example, the detecting module 133a generates in advance templates of peripheral image patterns for feature regions of heart such as the mitral valve, tricuspid valve, aorta valve, pulmonary valve, left (right) ventricular apex, left (right) ventricular outflow tract, and left (tight) ventricular anterior wall. The detecting module 133a then performs template matching on the volume data to detect the locations of the feature regions in the volume data automatically, and calculates the location parameters of the respective reference cross-sectional images based on the detected feature regions. The detection of the cross-sectional positions of reference cross-sectional images is not limited to template matching. For example, the detecting module 133a may, by constructing a classifier in advance by machine learning from the peripheral image patterns of the feature regions of heart, automatically detect the locations of the feature regions in the volume data by using the classifier. The detecting module 133a can also, by receiving the input of locations of the feature regions of heart by the operator via the input device 134, detect the cross-sectional positions of reference cross-sectional images. However, because this operation is very cumbersome and takes time, the method that automatically detects the detection locations of the respective reference cross-sectional images is generally preferable.

The detecting module 133a then stores cross-sectional image information including the cross-sectional positions of the reference cross-sectional images in the storage 132.

FIG. 5 is a table illustrating one example of the cross-sectional image information stored in the storage 132 in the first embodiment. FIG. 5 exemplifies a situation of the detecting module 133a detecting the cross-sectional positions of 15 types of reference cross-sectional images. For example, as illustrated in FIG. 5, the storage 132 stores therein information in which a name (ID) that is identification information to identify the type of reference cross-sectional image is associated with the cross-sectional position of the reference cross-sectional image detected by the detecting module 133a, for each of a plurality of reference cross-sectional images, as the cross-sectional image information.

For example, records in which the name (ID) of each reference cross-sectional image is set are stored in advance in the storage 132, and when the cross-sectional positions of the respective cross-sectional images are detected by the detecting module 133a, the respective cross-sectional positions are set in the cross-sectional image information based on the detection result. Alternatively, the cross-sectional image information may be generated by setting the name (ID) and cross-sectional position for each reference cross-section image when the cross-sectional position of each cross-sectional image is detected by the detecting module 133a.

While the example in FIG. 5 illustrates a situation in which the numerals "01" to "15" are used as the name (ID) that is the identification information to identify the types of reference cross-sectional images, the embodiment is not limited to this. For example, as the identification information, alphabets or symbols may be used, or the combinations of numerals, alphabets, and symbols may be used.

Figure 6:
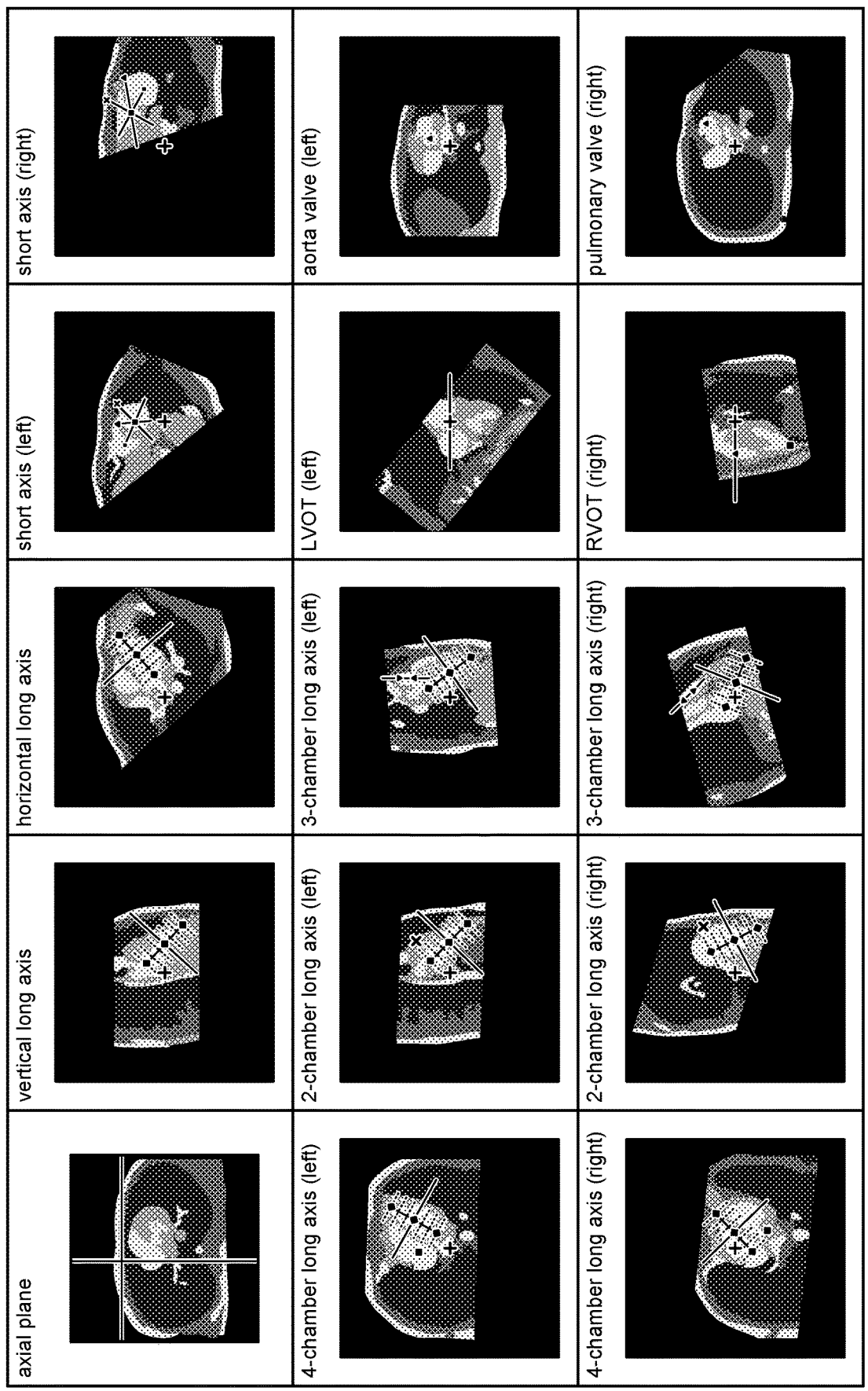
FIG. 6 is a diagram illustrating a display example of cross-sectional positions of reference cross-sectional images in the first embodiment.

The detecting module 133a subsequently displays the cross-sectional positions of reference cross-sectional images detected from the volume data in list form on the display 135. FIG. 6 is a diagram illustrating a display example of the cross-sectional positions of reference cross-sectional images in the first embodiment. The detecting module 133a generates, based on the detected cross-sectional positions of reference cross-sectional images, reference cross-sectional images from the volume data by multi-planar reconstruction (MPR) processing. As illustrated in FIG. 6, the detecting module 133a further displays the detected feature regions of heart (such as rhombuses, triangles, and x marks in FIG. 6), and cross lines with the cross-sectional positions of other reference cross-sectional images (such as solid lines and dotted lines in FIG. 6), superimposed on the generated respective reference cross-sectional images. Such a display is effective for checking the detection result by the operator, and the operator can perform the correction of cross-sectional positions on the display screen as appropriate.

While it has been exemplified that the cross-sectional positions of 15 types of reference cross-sectional images are detected from the volume data and the detection result thereof is displayed in list form in the first embodiment, the embodiment is not limited to this. The number of reference cross-sectional images detected from the volume data can be changed optionally. The display of cross-sectional positions in itself at this stage may be omitted. Furthermore, only the display image may be displayed, in which the cross-sectional position of the reference cross-sectional image to be first acquired in imaging scans is displayed superimposed on the multi-slice images.

Step S104: returning to FIG. 3, the setting module 133b then sets the types of reference cross-sectional images acquired in imaging scans, the order of imaging, and the combinations of superimposing images. In the first embodiment, the imaging scans are a plurality of scans corresponding to a plurality of protocols. Each of a plurality of reference cross-sectional images acquired by executing the respective scans is a cross-sectional image that intersects with one another. As described above, in the first embodiment, at the stage of setting the imaging condition at Step S101, the setting of imaging condition is performed also by correcting the preset setting information as necessary. In the first embodiment, at Step S104, the imaging condition is displayed again and checking is performed by the operator. However, either one of the setting at Step S101 and at Step S104 can be omitted. Alternatively, the setting at both may be omitted and automated.

Now, the types of reference cross-sectional images, the order of imaging, and the combinations of superimposing images assumed in the first embodiment will be described with reference to FIGS. 7 to 11.

Figure 7:
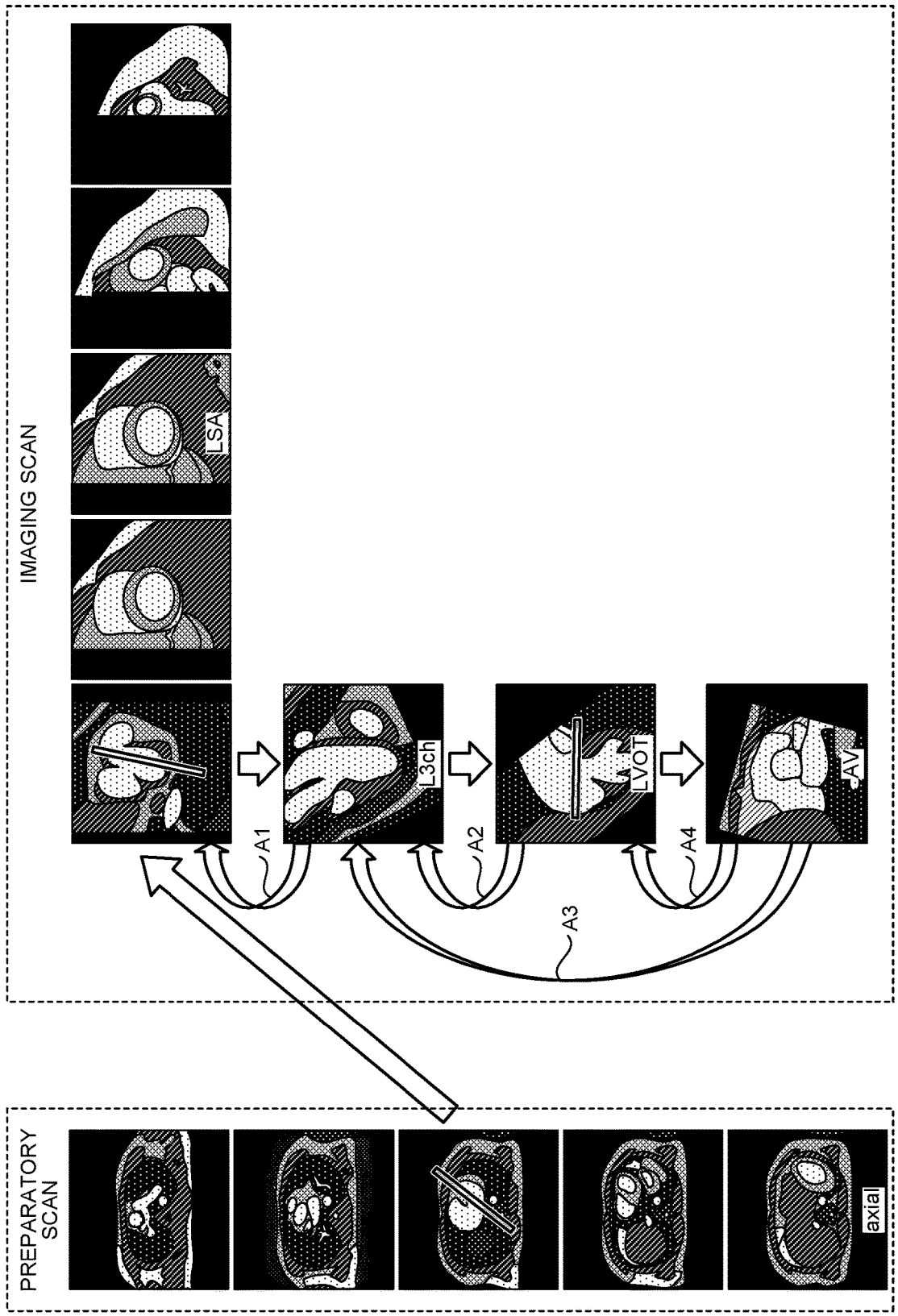
FIG. 7 is a diagram for explaining the order of imaging reference cross-sectional images in the first embodiment.

FIG. 7 is a diagram for explaining the order of imaging reference cross-sectional images in the first embodiment. As illustrated in FIG. 7, in the first embodiment, study of the aorta of heart is assumed. The five transverse section images displayed as "axial" in FIG. 7 correspond to multi-slice images that are the volume data acquired in the preparatory scans. As indicated by downward-pointing arrows in FIG. 7, the "left ventricular short-axis image (LSA)", "left ventricular 3-chamber long-axis image (L3ch)", "left ventricular outflow tract image (LVOT)", and "aorta valve image (AV)" are acquired in the above-described order in the imaging scans.

In FIG. 7, among those four reference cross-sectional images acquired in the imaging scans, upward-pointing arrows are displayed. These upward-pointing arrows represent the combinations indicating on which reference cross-sectional image, the cross-sectional position of a reference cross-sectional image planned to be acquired at a later stage is to be checked by the operator. More specifically, the arrow A1 in FIG. 7 represents that the cross-sectional position of the "left ventricular 3-chamber long-axis image (L3ch)" is to be displayed superimposed on the "left ventricular short-axis image (LSA)" to be checked. The arrows A2 and A3 in FIG. 7 represent that the respective cross-sectional positions of the "left ventricular outflow tract image (LVOT)" and the "aorta valve image (AV)" are to be displayed superimposed on the "left ventricular 3-chamber long-axis image (L3ch)" to be checked. The arrow A4 in FIG. 7 represents that the cross-sectional position of the "aorta valve image (AV)" is to be displayed superimposed on the "left ventricular outflow tract image (LVOT)" to be checked.

FIG. 8 is a table illustrating one example of the protocol information stored in the storage 132 in the first embodiment. As described above, the storage 132 stores therein in advance the protocol information that includes the setting information representing the combinations of reference cross-sectional images as one of the imaging parameters.

As illustrated in FIG. 8, the storage 132 stores therein the protocol information on preparatory scans and imaging scans stacked by the operator in accordance with the order of imaging (for the convenience of explanation, a part of the stacked preparatory scans and imaging scans is illustrated). The example illustrated in FIG. 8 represents the protocol information including the types of reference cross-sectional images, the order of imaging, and the combinations of superimposing displays illustrated in FIG. 7.

For example, as illustrated in FIG. 8, the storage 132 stores therein the name (ID) that is the identification information to identify the type of reference cross-sectional image, the type of second cross-sectional image (Confirm) displayed superimposed on the reference cross-sectional image, the range of imaging (FOV), the number of slices (NS), the number of time phases (NP), the matrix size (Matrix), and the flip angle (FA) being associated with one another, for each type of reference cross-sectional image (Protocol), as the protocol information. In FIG. 8, the specific numbers of various parameters are omitted for the sake of convenience in explanation.

The protocol information includes, as the setting information representing the combination of reference cross-sectional images, the name (ID) that identifies the type of first cross-sectional image, and the type of second cross-sectional image (Confirm). This combination represents the combination of superimposing display. As illustrated in FIG. 8, in the name (ID) that identifies the type of reference cross-sectional image, the name (ID) included in the cross-sectional image information illustrated in FIG. 5 is set. In the type of second cross-sectional image (Confirm) also, the type of reference image for which the cross-sectional position is displayed superimposed on the first reference image is set, using the name (ID). More specifically, the setting information representing the combination of the first cross-sectional image and the second cross-sectional image is defined by associating the identification information concerning the first cross-sectional image with the identification information concerning the second cross-sectional image.

For example, in the cross-sectional image information illustrated in FIG. 5, it is assumed that the reference image of the name (ID) of "04" is the "left ventricular short-axis image (LSA)", and the reference image of the name (ID) of "08" is the "left ventricular 3-chamber long-axis image (L3ch)". Furthermore, it is assumed that the reference image of the name (ID) of "09" is the "left ventricular outflow tract image (LVOT)", and the reference image of the name (ID) of "10" is the "aorta valve image (AV)". In that case, as illustrated in FIG. 8, in the protocol information, the name (ID) of the "left ventricular short-axis image (LSA)" is set to "04", the name (ID) of the "left ventricular 3-chamber long-axis image (L3ch)" is set to "08", the name (ID) of the "left ventricular outflow tract image (LVOT)" is set to "09", and the name (ID) of the "aorta valve image (AV)" is set to "10".

Then, as illustrated in FIG. 8, the type of second cross-sectional image (Confirm) in the record of the "left ventricular 3-chamber long-axis image (L3ch)" is set to "09" and "10". This represents that, after the "left ventricular 3-chamber long-axis image (L3ch)" is acquired, the cross-sectional position of the "left ventricular outflow tract image (LVOT)" and the cross-sectional position of the "aorta valve image (AV)", which are automatically detected from the volume data, are to be displayed superimposed on the reconstructed image.

FIG. 9 is a table for explaining a setting screen for the combination of superimposing images in the first embodiment. FIG. 9 illustrates an example of displaying, on the display 135 (a console screen) of the MRI apparatus 100, the setting of the types of reference cross-sectional images, the order of imaging, and the combinations of superimposing displays illustrated in FIG. 7. More specifically, FIG. 9 illustrates an example in which the protocol information illustrated in FIG. 8 is displayed on the display 135. For example, the setting module 133b displays the setting screen illustrated in FIG. 9 on the display 135, and receives the confirmation or correction by the operator via the input device 134.

As illustrated in FIG. 9, in each row of the setting screen, the protocol information on preparatory scans and imaging scans stacked by the operator is displayed in accordance with the order of imaging from the top (for the convenience of explanation, a part of the stacked preparatory scans and imaging scans is illustrated). By looking at the setting screen, the operator can understand the order of imaging. In each row of the setting screen illustrated in FIG. 9, there are, from the left, the index (Index) representing the order of imaging, the type of reference cross-sectional image (Protocol), the type of second cross-sectional image (Confirm) to be displayed superimposed on the reference cross-sectional image, the range of imaging (FOV), the number of slices (NS), the number of time phases (NP), the matrix size (Matrix), and the flip angle (FA). The operator can understand the detail of imaging parameters. In FIG. 9, a part of the imaging parameters is illustrated for the sake of convenience in explanation.

Out of the items displayed on the setting screen, the type of second cross-sectional image (Confirm) represents the combination of superimposing display. In the display of the setting screen illustrated in FIG. 9, because the type of reference cross-sectional image is identified by the index representing the order of imaging of each protocol, the type of second cross-sectional image (Confirm) is also displayed by using the index. For example, the "left ventricular short-axis image (LSA)", the "left ventricular 3-chamber long-axis image (L3ch)", the "left ventricular outflow tract image (LVOT)", and the "aorta valve image (AV)" are given with the alphabets of "E", "F", "G", and "H", respectively, as the index. For example, in FIG. 9, in the type of second cross-sectional image (Confirm) on the row of "F", the "G" and "H" are displayed. This represents that, after the "left ventricular 3-chamber long-axis image" of "F" is acquired, the cross-sectional positions of the "left ventricular outflow tract image" of "G" and the "aorta valve image" of "H", which are automatically detected from the volume data, are to be displayed superimposed on the reconstructed image. For example, if the index is a symbol indicative of the order of imaging, it is easy to understand. For example, if alphabets are used as in the example illustrated in FIG. 9, the information is expressed in short and the order can be expressed in alphabetical order. It may be made easier to distinguish by coloring the alphabets, for example.

Now, the processing of displaying the above-described setting screen will be described in detail. For example, when the setting module 133b displays the setting screen, the setting module 133b displays the information on each reference cross-sectional image based on the protocol information stored in the storage 132. Specifically, when the setting module 133b displays the information on each reference cross-sectional image on the setting screen, the setting module 133b refers to the protocol information stored in the storage 132, and in accordance with the order of the stored protocol information, displays the rows of the respective reference cross-sectional images on the setting screen from top to bottom. At this time, as the indices of the respective reference cross-sectional images, the setting module 133b displays alphabets from the top.

For example, as illustrated in FIG. 9, when the setting module 133b sets "D" to the index of multi-slice images acquired in the preparatory scans, the setting module 133b displays "E" as the index of the "left ventricular short-axis image (LSA)" that follows. The setting module 133b further displays "F", "G", and "H" as the indices of the subsequent "left ventricular 3-chamber long-axis image (L3ch)", the "left ventricular outflow tract image (LVOT)", and the "aorta valve image (AV)", respectively.

The setting module 133b, for each reference cross-sectional image displayed on the setting screen, further refers to the appropriate protocol information and identifies the name (ID) that is set to the type of second cross-sectional image (Confirm). The setting module 133b then, out of the indices of the respective reference cross-sectional images displayed on the setting screen, identifies the index of the reference cross-sectional image corresponding to the identified name (ID) and displays the identified index to the type of second cross-sectional image (Confirm) on the setting screen.

For example, as illustrated in FIG. 8, it is assumed that the protocol information on the respective reference cross-sectional images has been set. In that case, when the setting module 133*b* displays the row of the "left ventricular 3-chamber long-axis image (L3ch)", for example, the setting module 133*b* refers to the protocol information on the "left ventricular 3-chamber long-axis image (L3ch)" and identifies that the names (ID) of "09" and "10" are set to the type of second cross-sectional image (Confirm). Subsequently, the setting module 133*b* identifies that, based on the indices of the respective reference cross-sectional images displayed on the setting screen, the index of the "left ventricular outflow tract image (LVOT)" corresponding to the name (ID) of "09" is "G" and the index of the "aorta valve image (AV)" corresponding to the name (ID) of the "10" is "H". The setting module 133*b* then, as illustrated in FIG. 9, displays the identified indices of "G" and "H" as the type of second cross-sectional image (Confirm) to be displayed on the row of the "left ventricular 3-chamber long-axis image (L3ch)".

When the setting module 133*b* receives, after displaying the setting screen, the operation to correct the type of reference cross-sectional image, the order of imaging, or the combination of superimposing display via the input device 134, the setting module 133*b* updates the protocol information stored in the storage 132 in accordance with the received operation. At this time, by associating the identification information concerning the first cross-sectional image with the identification information concerning the second cross-sectional image, the setting module 133*b* sets the combination of the first cross-sectional image and the second cross-sectional image. More specifically, in the first embodiment, the setting module 133*b* sets the combination of the first cross-sectional image and the second cross-sectional image by associating the name (ID) concerning the first cross-sectional image with the name (ID) concerning the second cross-sectional image.

FIG. 10 is a table for explaining the updating of protocol information via the setting screen in the first embodiment. For example, it is assumed that, on the setting screen illustrated in FIG. 9, the operator has made an operation to add the "left ventricular 4-chamber long-axis image (L4ch)" between the "left ventricular short-axis image (LSA)" and the "left ventricular 3-chamber long-axis image (L3ch)". In that case, as illustrated in FIG. 10, the setting module 133*b* adds the record of the "left ventricular 4-chamber long-axis image (L4ch)" between the record of the "left ventricular short-axis image (LSA)" and the record of the "left ventricular 3-chamber long-axis image (L3ch)".

At this time, if the name (ID) of the "left ventricular 4-chamber long-axis image (L4ch)" is assumed to be "06", for example, as illustrated in FIG. 10, the setting module 133*b* sets "06" to the name (ID) included in the record of the "left ventricular 4-chamber long-axis image (L4ch)". The setting module 133*b* further sets the range of imaging (FOV), the number of slices (NS), the number of time phases (NP), the matrix size (Matrix), and the flip angle (FA) input by the operator on the setting screen to the respective items included in the record of the "left ventricular 4-chamber long-axis image (L4ch)".

When the index representing the type of second cross-sectional image (Confirm) is received on any of the reference cross-sectional images (first cross-sectional image) displayed on the setting screen, the setting module 133*b* refers to the protocol information on the reference cross-sectional image corresponding to the received index and identifies the name (ID) given to the reference cross-sectional image. The setting module 133*b* then sets the identified name (ID) to the item of the type of second cross-sectional image (Confirm) in the preset information corresponding to the reference cross-sectional image (first cross-sectional image) for which the index is received.

When an index representing the type of second cross-sectional image (Confirm) is received on the setting screen, there may be a case in which, before the acquisition of reference cross-sectional image (first cross-sectional image) of the received index, the acquisition of the reference cross-sectional image corresponding to the index is not yet stacked. In that case, the setting module 133*b* may be configured to display a message stating that there is no reference cross-sectional image corresponding to the received index in the reference cross-sectional images acquired in advance. Displaying such a message can prompt the operator to consider reentering the index or adding the acquisition of the reference cross-sectional image (first cross-sectional image), for example.

When the setting module 133*b* receives the operation to modify the type of reference cross-sectional image, the order of imaging, or the combination of superimposing display via the input device 134, the setting module 133*b* updates the protocol information as described above and changes the display on the setting screen as well. Specifically, when the setting module 133*b* receives the operation to modify the type of reference cross-sectional image, the order of imaging, or the combination of superimposing display, the setting module 133*b* changes the information on each reference cross-sectional image based on the updated protocol information.

FIG. 11 is a table for explaining the changes in display of the setting screen in the first embodiment. For example, as the same as the above-described example, it is assumed that, on the setting screen illustrated in FIG. 9, the operator has made an operation to add the "left ventricular 4-chamber long-axis image (L4ch)" between the "left ventricular short-axis image (LSA)" and the "left ventricular 3-chamber long-axis image (L3ch)". In that case, the setting module 133*b* first updates the protocol information as described above.

The setting module 133*b* then refers to the updated protocol information, and in accordance with the order of the stored protocol information, redisplays the rows of the respective reference cross-sectional images on the setting screen. Consequently, as illustrated in FIG. 11, the row of the "left ventricular 4-chamber long-axis image (L4ch)" is added and displayed between the row of the "left ventricular short-axis image (LSA)" and the row of the "left ventricular 3-chamber long-axis image (L3ch)".

At this time, the index of each reference cross-sectional image is newly assigned again. Specifically, the index of the "left ventricular short-axis image (LSA)" displays the "E" unchanged and the index of the added "left ventricular 4-chamber long-axis image (L4ch)" displays an "F" that follows. The indices of the subsequent "left ventricular 3-chamber long-axis image (L3ch)", the "left ventricular outflow tract image (LVOT)", and the "aorta valve image (AV)" display "G", "H", and "I", respectively.

Along with the reassignment of indices of the respective reference cross-sectional images, the display of the type of second cross-sectional image (Confirm) corresponding to each reference cross-sectional image is also changed. For example, under the condition of the setting screen illustrated in FIG. 9, the indices of "G" and "H" were displayed in the row of the "left ventricular 3-chamber long-axis image (L3ch)" as the type of second cross-sectional image (Confirm). However, along with the reassignment of the index of the "left ventricular outflow tract image (LVOT)" from "G" to "H" and the reassignment of the index of the "aorta valve image (AV)" from "H" to "I", as illustrated in FIG. 11, the indices of the type of second cross-sectional image (Confirm) displayed on the row of the "left ventricular 3-chamber long-axis image (L3ch)" are also changed from "G" and "H" to "H" and "I".

As described above, in the first embodiment, the type of reference cross-sectional image is assigned with the name (ID), and the name (ID) and the detection position of the reference cross-sectional image automatically detected at Step S103 are stored being associated with each other. Consequently, the detection result of reference cross-sectional images at Step S103 is automatically reflected on the setting information. This makes cumbersome operations unnecessary and is also effective. In the same manner, the type of second cross-sectional image displayed superimposed on the reference cross-sectional image is also selected by the name (ID).

Step S105: referring back to FIG. 3, the sequence controller 120 subsequently executes imaging scans. The sequence controller 120 first determines whether imaging scans are finished, that is, whether the stacked protocols are left. If no stacked protocol is left (Yes at Step S105), the sequence controller 120 ends the processing.

Step S106: meanwhile, if the stacked protocols are left (No at Step S105), the sequence controller 120 acquires reference cross-sectional images in accordance with the order of imaging. As described above, the reference cross-sectional image acquired at this time is referred to as a first cross-sectional image for the convenience of explanation. In the following description, the explanation is continued assuming that the imaging of "F" (cine imaging of "left ventricular 3-chamber long-axis image") illustrated in FIG. 9 has been executed at Step S106.

Step S107: the generating module 133c then generates a first cross-sectional image by reconstructing the reference cross-sectional image acquired at Step S106, and generates a display image in which the cross-sectional position of the second cross-sectional image set in the combination of superimposing display is superimposed on the generated first cross-sectional image. For example, the generating module 133c refers to the protocol information stored in the storage 132, and generates a display image based on the setting information that represents the combination of the first cross-sectional image and the second cross-sectional image and is included in the protocol information. The generating module 133c then displays the generated display image on the display 135.

FIG. 12 is a diagram illustrating a display example of display images in the first embodiment. As illustrated in FIG. 12, in the first embodiment, illustrated is an example in which the display images generated by the generating module 133c and the setting information set at Step S104 are displayed together on the display 135. Describing the setting information first, at this stage, the "D" and "E" have been acquired already, the "F" corresponds to the display image currently acquired and reconstructed, and the "G" and "H" are planned to be acquired at later stages. There are blank rows above and below the row of "F". In this manner, it may be indicated that the "F" corresponds to the current acquisition, for example.

The generating module 133c displays, in juxtaposition, a reconstructed image I1 of the "left ventricular 3-chamber long-axis image (L3ch)", a display image I2 in which the cross-sectional position of the "left ventricular outflow tract image (LVOT)", which is one of the second cross-sectional images, is displayed superimposed on the reconstructed image of the "left ventricular 3-chamber long-axis image (L3ch)", and a display image I3 in which the respective cross-sectional positions of the "left ventricular outflow tract image (LVOT)" and the "aorta valve image (AV)", which are all of the second cross-sectional images, are displayed superimposed on the reconstructed image of the "left ventricular 3-chamber long-axis image (L3ch)". As present in the display image I2 and the display image I3, when a plurality of second cross-sectional images are set in the combination of superimposing display, it is preferable that the information of index be displayed together with the cross-sectional positions. Alternatively, the identification method of the second cross-sectional images is not limited to indices, and may be color-coded display.

In the first embodiment, the sequence controller 120 acquires the "left ventricular short-axis image", "left ventricular 3-chamber long-axis image", "left ventricular outflow tract image", and "aorta valve image" in groups of time-series images. The generating module 133c then generates display images in which the cross-sectional position of the second cross-sectional image is superimposed on the first cross-sectional images displayed in the time-series order, and displays the generated display images on the display 135. For example, the generating module 133c generates display images in which the cross-sectional position of the "left ventricular outflow tract image" detected from the volume data is superimposed in a still state on the reconstructed images of the "left ventricular 3-chamber long-axis image" displayed as a moving image, and displays the generated display images on the display 135.

As described above, for the study of heart in particular, the confirmation or correction of the imaging position in consideration of the heartbeat time phase, which is not possible to check with the volume data that has been acquired at a specific heartbeat time phase, can be performed efficiently. More specifically, in the case of heart, by the conventional methods, it has been possible to check the automatically detected cross-sectional position of reference cross-sectional image, only at the heartbeat time phase at the time of acquiring the multi-slice images. On this point, with the reference cross-sectional image such as an aorta valve image and a pulmonary valve image, it is important that the cross-sectional position thereof is checked in consideration of the heartbeat time phase. In accordance with the first embodiment, the reference cross-sectional image is acquired in cine imaging, and on the reference cross-sectional image that is displayed as a moving image, it is possible to check the cross-sectional position of the reference cross-sectional image that is planned to be acquired at a later stage. This enables consideration of the heartbeat time phase at the time of setting the cross-sectional position.

The embodiment is not limited to the above-described display example. That is, the generating module 133c does not necessarily need to display the three display images in juxtaposition, and the generating module 133c may, for example, display these display images by switching one by one. Alternatively, for example, the generating module 133c may generate only the display image I3 and display only the display image I3. Otherwise, the generating module 133c may generate the same number of display images as the number of second cross-sectional images, and may display one of a plurality of cross-sectional positions of the second cross-sectional images superimposed on each of the display images. In other words, the method of displaying the display images (such as how many display images are to be displayed, and how many cross-sectional positions of the second cross-sectional images are to be displayed superimposed on the first cross-sectional image when there are a plurality of cross-sectional positions of the second cross-sectional images) can be changed optionally.

For example, when the automatic detection of the cross-sectional position at Step S103 is performed based on the position of the feature region of heart, the generating module 133c can display the feature regions relevant to the cross-sectional position of the first cross-sectional image and the second cross-sectional image (for example, the rhombuses, triangles, and x marks illustrated in FIG. 6) superimposed on the display image together. Such a superimposing display can indicate the feature regions of heart so as to be easy to understand for the operator and thus is useful.

Step S108: returning to FIG. 3, the correcting module 133d then determines whether a correction operation from the operator is received on the display image displayed at Step S107. If the correction operation is not received (No at Step S108), the procedure returns to the processing performed by the sequence controller 120 at Step S105.

Step S109: meanwhile, if the correction operation is received (Yes at Step S108), the correcting module 133d corrects the cross-sectional position of the second cross-sectional image, and overwrites the cross-sectional position of the cross-sectional image information concerning the second cross-sectional image stored in the storage 132. FIGS. 13A to 13C are diagrams for explaining the correction of cross-sectional positions in the first embodiment. FIG. 13A is the display image I3 first displayed at Step S107. In this example, it is assumed that the cross-sectional position of the second cross-sectional image set by the automatic detection from the volume data is slightly out of position from the duct direction of the aorta portrayed on the actually acquired first cross-sectional image. The need of such a correction arises when, between the acquisition of volume data of a target to detect the cross-sectional position of the reference cross-sectional image and the acquisition of the actually detected reference cross-sectional image, the subject P has moved or the information on heartbeat not known at the time the volume data is acquired is added.

Consequently, as illustrated in FIG. 13B, the operator corrects the position and angle of the aorta valve image ("H") via a mouse or the like of the input device 134, for example. The correcting module 133d then receives the correction operation concerning the cross-sectional position of the aorta valve image by the modification operation to modify at least one of the position and the angle thereof, calculates the location parameters of the aorta valve image after the correction, and overwrites the location parameters of the aorta valve image stored in the storage 132. The correcting module 133d can further correct, based on the spatial correlation of a plurality of cross-sectional positions, the cross-sectional position of the other second cross-sectional image relevant to the cross-sectional position corrected by the operator (for example, the reference cross-sectional image that is in a crossing relation), in conjunction with the correction. For example, by giving the restriction in which the left ventricular outflow tract image ("G") that is another second cross-sectional image to be acquired at a further later stage and the aorta valve image ("H") are in an orthogonal relation, as illustrated in FIG. 13C, the correcting module 133d can also correct and overwrite the location parameters of the left ventricular outflow tract image ("G") automatically. In this case, by the correction of the cross-sectional position of a single reference cross-sectional image, the cross-sectional position of the other reference cross-sectional image that is relevant to the reference cross-sectional image and the cross-sectional position of the other reference cross-sectional image that is planned to be acquired at a later stage than the reference cross-sectional image are also corrected automatically in conjunction, whereby efficiency is further promoted.

The correction of cross-sectional positions is not limited to the above-described method. For example, when the feature region of heart is also displayed superimposed on the display image, the correcting module 133d can receive the modification operation of the position of the feature region of heart displayed superimposed, and in accordance with the feature region after the correction, can automatically correct (recalculate again) all of the location parameters of the reference cross-sectional images that are planned to be acquired at later stages. Such a correction is also useful.

For example, when the cross-sectional position of the second cross-sectional image is corrected, the correcting module 133d may add a flag indicative of the presence of correction to the second cross-sectional image itself and to the other reference cross-sectional images relevant to the second cross-sectional image so that they can be checked on the setting screen and on the image data after the reconstruction. For example, there are cases in which the reference cross-sectional images are displayed in juxtaposition at the time of diagnosis. At this time, if the information indicative of positional correlation and the information of the presence of correction, if any, are displayed, it is useful.

For example, in the setting information on the setting screen illustrated in FIG. 12, the correcting module 133d adds flags indicative of the presence of correction to the name (ID) that is given to each of the reference cross-sectional images and to the name (ID) of the second cross-sectional image in the "Confirm" field. For example, if the correction is made on the cross-sectional position of the second cross-sectional image of "H", the correcting module 133d displays it as "H'".

If the image data after the reconstruction is digital imaging and communications in medicine (DICOM) data, for example, the correcting module 133d adds, to the supplementary information (for example, a private tag) of DICOM, supplementary information indicative of "correction present" representing that the correction of cross-sectional positions has been made. Furthermore, the correcting module 133d may add, in addition to the supplementary information indicative of "correction present" or in place of the supplementary information indicative of "correction present", at least either of the location parameters representing the cross-sectional position after the correction or the location parameters automatically detected from the volume data. When the correction of cross-sectional positions is made in the course of imaging scans, among a plurality of reference cross-sectional images acquired in the imaging scans, the positional correlation is to be broken. Consequently, adding such information to the image data after the reconstruction, and having an image display device, which displays the image data, refer to the supplementary information and display the information indicative of the presence of correction and the information before and after the correction, as necessary, are useful in particular when used in diagnosis later. It is not limited to the supplementary information of DICOM, and when the data format is a private format, it only needs to be added to the supplementary information in the private format.

Furthermore, when the cross-sectional position of the second cross-sectional image is corrected, the accuracy of the cross-sectional position of the first cross-sectional image is also questionable. Consequently, when the second cross-sectional image is acquired after the cross-sectional position of the second cross-sectional image is corrected, the generating module 133c may generate a display image in which the cross-sectional position of the first cross-sectional image corresponding to the display image on which the correction operation is received is displayed superimposed on the acquired second cross-sectional image, and display the generated display image on the display 135. It is useful to let the operator check the cross-sectional position of the first cross-sectional image used for the correction. That is, when the operator deems that the accuracy of the cross-sectional position of the first cross-sectional image is also questionable by the check, the first cross-sectional image can be acquired again by manual control. Furthermore, for example, when the cross-sectional position of the second cross-sectional image is corrected, the sequence controller 120 may execute control such that the first cross-sectional image corresponding to the display image on which the correction operation is received is acquired again automatically.

As described above, in accordance with the first embodiment, the MRI apparatus 100, each time a reference cross-sectional image is acquired in imaging scans, reconstructs the acquired cross-sectional image, generates a display image in which the cross-sectional position of a reference cross-sectional image planned to be acquired at a later stage is displayed superimposed on the reconstructed image, and displays the generated display image on the display 135. In other words, the MRI apparatus 100 generates a display image in which the cross-sectional position of a reference cross-sectional image planned to be acquired in imaging scans is superimposed on a reference cross-sectional image for which the acquisition order is close to that for the reference cross-sectional image planned to be acquired and which has been acquired already in the imaging scans, and displays the generated display image on the display 135. Consequently, the positioning operation of a cross-sectional image can be performed appropriately and easily. More specifically, because the operator can efficiently check and correct the cross-sectional position of a reference cross-sectional image on an image acquired temporally close to it, the influence of displacement in imaging position due to the body movement of the subject P during imaging can be reduced, for example.

Other Embodiments

The embodiment is not limited to the above-described first embodiment.

Target Region

In the above-described embodiment, it has been explained with the example of "heart" as the target region. The embodiment, however, is not limited to this. For example, the embodiment can be applied in the same manner to the study of target regions other than the heart such as "brains" and joints such as "shoulders" and "knees".

For example, in the imaging of a shoulder joint, there are cases in which, for example, the positioning of oblique coronal section images that are parallel to the shoulder blade and oblique sagittal section images that are orthogonal to the shoulder blade, which are to be acquired in imaging scans, is performed on the volume data (a plurality of transverse section images) acquired in preparatory scans, before the imaging scans. In this case, when an oblique coronal section image (a first cross-sectional image) is acquired in the imaging scans, the generating module 133c generates a display image in which, on the acquired oblique coronal section image, the cross-sectional position that is of a sagittal section image before acquisition (a second cross-sectional image) and is detected from the volume data is superimposed, and displays the generated display image on the display 135.

Type of Cross-Sectional Image

In the above-described embodiment, it has been described that the cross-sectional positions of 15 types of reference cross-sectional images are detected from the volume data and displayed. The embodiment, however, is not limited to this and the number, type, display method, and others of the reference cross-sectional images detected can be changed optionally. The type, acquisition order, combination of superimposing display of the reference cross-sectional images assumed in the above-described embodiment can also be changed optionally. However, because the setting procedure thereof is generally very complicated, as described in the first embodiment, it is preferable that the type, acquisition order, and combination of superimposing display of reference cross-sectional images be stored in advance in the storage 132 as the preliminary setting information for each purpose of imaging, so that the operator can select the stored preliminary setting information before a study.

Automatic Correction

In the above-described embodiment, the correction example of letting the operator correct the cross-sectional position of the second cross-sectional image has been explained. The correction method, however, is not limited to this, and the cross-sectional position of the second cross-sectional image may be corrected automatically. In this case, the initial value of the cross-sectional position of the second cross-sectional image (that is, the cross-sectional position detected from the volume data acquired in the preparatory scans) does not necessarily need to be superimposed on the first cross-sectional image as described above. In this case, the generating module 133c may generate a display image in which the corrected cross-sectional position of the second cross-sectional image is superimposed on the first cross-sectional image and display the generated display image on the display 135 to let the operator check only when automatic correction has been performed.

Naturally, it is also possible to omit this display itself and to perform the imaging scans that acquire a plurality of cross-sectional images in sequence fully automatically. Alternatively, the generating module 133c may normally display a display image in which the initial value of the cross-sectional position of the second cross-sectional image is superimposed on the first cross-sectional image, and may display a display image in which the corrected cross-sectional position of the second cross-sectional image is superimposed on the first cross-sectional image only when it has been corrected. Thus, each time the first cross-sectional image is acquired in imaging scans, the correcting module 133d detects the cross-sectional position of the second cross-sectional image before acquisition by using the acquired first cross-sectional image, and corrects the initial value of the cross-sectional position of the second cross-sectional image. Furthermore, when the initial value is corrected, the generating module 133c generates a display image in which the cross-sectional position of the second cross-sectional image after the correction is superimposed on the first cross-sectional image as necessary.

Describing the method of automatic correction, for example, the correcting module 133d can correct the cross-sectional position of the second cross-sectional image automatically, by comparing the MPR image generated at Step S103 with the reconstructed image at Step S107, or by applying the template or the classifier used at Step S103 to the reconstructed image at Step S107. The correcting module 133d does not necessarily perform the correction automatically, and can output warning information stating there is a need to correct the cross-sectional position of the first cross-sectional image or the second cross-sectional image and receive an acceptance from the operator to execute the correction or let the correction itself be made by the operator. Automatic correction as described above can further reduce the work of the operator and is useful.

Furthermore, the correcting module 133d can perform automatic correction taking heartbeat time phase into consideration. For example, considered is a situation in which the sequence controller 120 acquires the second cross-sectional image at a specific heartbeat time phase at which the delay time from a feature wave is defined to be a given time while acquiring the first cross-sectional images in cine imaging. In such a case, because the initial value of the cross-sectional position of the second cross-sectional image is detected from the volume data acquired in the preparatory scans, it may not coincide with the delay time (heartbeat time phase) at which the second cross-sectional image is actually acquired. Consequently, for example, when the first cross-sectional images are acquired in cine imaging, the correcting module 133d may identify the data that corresponds to the delay time (heartbeat time phase) at which the second cross-sectional image is actually acquired out of the groups of data in the time series, newly detect the cross-sectional position of the second cross-sectional image by using the identified data, and automatically correct the cross-sectional position of the second cross-sectional image.

Volume Data in Imaging Scans

In the above-described embodiment, it has been exemplified that a plurality of cross-sectional positions are detected from the volume data acquired in the preparatory scans and the cross-sectional positions are displayed superimposed on the reference cross-sectional images acquired in the imaging scans. The embodiment, however, is not limited to this. For example, the volume data is not limited to the data acquired in the preparatory scans, and it may be the data acquired during the imaging scans. For example, when the reference cross-sectional images are acquired by a plurality of protocols in the imaging scans in sequence, the volume data may be acquired as one of them. In such a case, for example, the detecting module 133a detects the cross-sectional position of one or a plurality of reference cross-sectional images planned to be acquired at later stages from the volume data acquired during the imaging scans. The generating module 133c then generates a display image in which a cross-sectional position that is of a second cross-sectional image before acquisition and detected from the volume data acquired during the imaging scans is superimposed on the first cross-sectional image acquired immediately before, and displays the generated display image on the display 135.

When the volume data that is the detection source of the cross-sectional position is the volume data in the time series acquired in cine imaging, the cross-sectional position detected from the volume data can be a group of cross-sectional positions in the time series. In this case, for example, the generating module 133c may generate a display image in which the group of cross-sectional positions of the second cross-sectional images is displayed as a moving image is superimposed on the first cross-sectional image displayed as a moving image and display the generated display image.

Specific Numerical Values and Order of Processing

Specific numerical values and the order of processing illustrated in the above-described embodiment are mere examples in principle.

Program

The instructions indicated in the processing procedure illustrated in the above-described embodiment can be executed based on a computer program that is software. A general-purpose computer stores therein the computer program in advance, and by reading in the computer program, the same effect as that by the MRI apparatus 100 in the above-described embodiment can be achieved. The instructions described in the above-described embodiment are recorded as a computer executable program in a magnetic disk (flexible disk, hard disk, and others), an optical disc (CD-ROM, CD-R, CD-RW, DVD-ROM, DVD±R, DVD±RW, and others), a semiconductor memory, or a recording medium similar to the foregoing. As long as it is a storage medium readable by the computer or an embedded system, the memory format thereof may be in any form. When the computer reads in the program from the recording medium and causes the CPU to execute, based on the program, the instructions described in the program, the same operation as that of the MRI apparatus 100 in the above-described embodiment can be implemented. Naturally, when the computer acquires or reads in the program, the computer may acquire or read it via a network.

Furthermore, the operating system (OS) running on the computer based on the instructions of the program installed on the computer or the embedded system from the storage medium, database management software, or middleware (MW) such as a network may execute a part of the respective processing to implement the above-described embodiment. Moreover, the storage medium is not limited to a medium independent of the computer or the embedded system, and also includes a storage medium in which a computer program transmitted via a local area network (LAN) or the Internet is downloaded and stored or temporarily stored. The storage medium is not limited to a single medium, and the embodiment includes a situation in which the processing in the above-described embodiment is executed from a plurality of media, and thus the configuration of the medium may be in any configuration.

The computer or the embedded system in the embodiment is to execute the respective processing in the above-described embodiment based on the computer program stored in the storage medium, and may be of any configuration such as a device composed of a single device such as a personal computer or a micro-computer and a system in which a plurality of devices are connected via a network. The computer in the embodiment is not limited to a personal computer, and includes an arithmetic processing unit, micro-computer, and others included in an information processing apparatus, and thus the computer is a generic term for the devices and apparatuses that can implement the functions in the embodiment by a computer program.

In accordance with the magnetic resonance imaging apparatus in at least one of the embodiments described above, the positioning operation of a cross-sectional image can be performed easily and appropriately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a processor; and
a memory that stores processor-executable instructions that cause the processor to:
detect, from volume data of a target region, a position of a first slice to be imaged and a position of a second slice to be imaged after the first slice has been imaged, the first and second slices containing respectively different anatomical characteristics of a target region to be imaged
image and display said first slice based on the position previously detected from the volume data; and
after imaging the first slice and prior to imaging the second slice, display, on the imaged and displayed first slice, the position of the second slice as previously detected from the volume data.

2. The magnetic resonance imaging apparatus according to claim 1, wherein, the first slice is an image acquired by cine imaging.

3. The magnetic resonance imaging apparatus according to claim 1, wherein, the target region is a brain.

4. The magnetic resonance imaging apparatus according to claim 1, wherein, the target region is a heart.

5. The magnetic resonance imaging apparatus according to claim 4, wherein, the slices include at least one of a short-axis image, a horizontal long-axis image, a vertical long-axis image, a 2-chamber image, a 3-chamber image and 4-chamber image.

6. The magnetic resonance imaging apparatus according to claim 4, wherein, the slices are composed of a combination of slices selected from among a short-axis image, a horizontal long-axis image, a vertical long-axis image, a 2-chamber image, a 3-chamber image and 4-chamber image.

7. The magnetic resonance imaging apparatus according to claim 1, wherein, the target region is a joint region.

8. The magnetic resonance imaging apparatus according to claim 7, wherein, the target region is a knee.

9. The magnetic resonance imaging apparatus according to claim 7, wherein, the target region is a shoulder.

10. A slice position displaying method comprising:
detecting, from volume data of a target region, a position of a first slice to be imaged and a position of a second slice to be imaged after the first slice has been imaged, the first and second slices containing respectively different anatomical characteristics of a target region to be imaged;
imaging and displaying said first slice based on the position previously detected from the volume data; and
after imaging the first slice and prior to imaging the second slice, displaying, on the imaged and displayed first slice, the position of the second slice as previously detected from the volume data.

11. The slice position displaying method according to claim 10, wherein, the first slice is an image acquired by cine imaging.

12. The slice position displaying method according to claim 10, wherein, the target region is a brain.

13. The slice position displaying method according to claim 10, wherein, the target region is a heart.

14. The slice position displaying method according to claim 13, wherein, the slices include at least one of a short-axis image, a horizontal long-axis image, a vertical long-axis image, a 2-chamber image, a 3-chamber image and 4-chamber image.

15. The slice position displaying method according to claim 13, wherein, the slices are composed of a combination of slices selected from among a short-axis image, a horizontal long-axis image, a vertical long-axis image, a 2-chamber image, a 3-chamber image and 4-chamber image.

16. The slice position displaying method according to claim 10, wherein, the target region is a joint region.

17. The slice position displaying method according to claim 16, wherein, the target region is a knee.

18. The slice position displaying method according to claim 16, wherein, the target region is a shoulder.

* * * * *